United States Patent
Saha

(10) Patent No.: US 9,182,441 B2
(45) Date of Patent: Nov. 10, 2015

(54) METHOD AND DEVICE FOR FAULT LOCATION OF SERIES-COMPENSATED TRANSMISSION LINE

(75) Inventor: Murari Saha, Vasteras (SE)

(73) Assignee: ABB Technology AG (CH)

( * ) Notice: Subject to any disclaimer, the term of this patent is extended or adjusted under 35 U.S.C. 154(b) by 1316 days.

(21) Appl. No.: 13/008,782

(22) Filed: Jan. 18, 2011

(65) Prior Publication Data
US 2011/0178741 A1 Jul. 21, 2011

Related U.S. Application Data

(63) Continuation of application No. PCT/EP2008/059424, filed on Jul. 18, 2008.

(51) Int. Cl.
*G01R 31/08* (2006.01)
*G01R 31/02* (2006.01)

(52) U.S. Cl.
CPC ............ *G01R 31/085* (2013.01); *G01R 31/088* (2013.01); *G01R 31/025* (2013.01); *G01R 31/08* (2013.01)

(58) Field of Classification Search
CPC .. G01R 31/025; G01R 31/088; G01R 31/085; G01R 31/086; G01R 31/08
USPC .......................................................... 702/59
See application file for complete search history.

(56) References Cited

U.S. PATENT DOCUMENTS

| | | | | |
|---|---|---|---|---|
| 6,442,493 B1 * | 8/2002 | Jurisch et al. | ........... | 702/59 |
| 6,529,010 B1 | 3/2003 | Saha et al. | | |
| 2007/0156358 A1 * | 7/2007 | Saha et al. | ........... | 702/59 |

FOREIGN PATENT DOCUMENTS

| | | | |
|---|---|---|---|
| WO | WO 2007032697 A1 * | 3/2007 | |
| WO | 2007079990 A1 | 7/2007 | |
| WO | WO 2007079990 A1 * | 7/2007 | |

OTHER PUBLICATIONS

Saha, et al.; "A new accurate fault locating algorithm for series compensated lines", IEEE Transactions on Power Delivery; vol. 14, No. 3, Jul. 1999, pp. 789-797 (1 page abstract only).
Kizilcay, et al.; "A New Unsynchronized Two-Terminals Fault Location Method on Series Compensated Lines"; Power Tech IEEE Russia; Jun. 27, 2005; pp. 1-7.
Saha, et al.; "Accurate Location of Faults on Series-Compensated lines with use of two-end Unsynchronised Measurements"; The Institution of Engineering and Technology; Mar. 20, 2008; pp. 338-343.
International Preliminary Report on Patentability; PCT/EP2008/059424; Sep. 29, 2010; 20 pages.
International Search Report and Written Opinion of the International Searching Authority; PCT/EP2008/059424; Apr. 7, 2009; 13 pages.

* cited by examiner

*Primary Examiner* — Eliseo Ramos Feliciano
*Assistant Examiner* — Terence Stifter, Jr.
(74) *Attorney, Agent, or Firm* — Whitmyer IP Group LLC

(57) ABSTRACT

A transmission line system, a device for fault protection and computer programs, and a method for locating a fault in a series-compensated two-terminal power transmission line including a compensating bank for providing series-compensation to the transmission line. Different subroutines are utilized for locating faults on line segments from the first terminal to the compensating bank and line segments from the second terminal to the compensating bank. A selection is then made in order to determine a valid result. The subroutines utilize three phase currents synchronized measurements from both terminals and a three phase voltage measurements from one terminal for determining the respective per unit distance to a fault.

18 Claims, 5 Drawing Sheets

METHOD AND DEVICE FOR FAULT LOCATION OF SERIES-COMPENSATED TRANSMISSION LINE

CROSS-REFERENCE TO RELATED APPLICATIONS

The present application is a continuation of pending International patent application PCT/EP2008/059424 filed on Jul. 18, 2008 which designates the United States, the content of which is incorporated herein by reference.

FIELD OF THE INVENTION

The present invention relates generally to the field of electrical power distribution systems, and in particular to methods for protection and to protection equipment within such systems.

BACKGROUND OF THE INVENTION

An electrical transmission system comprises protection means arranged to protect, monitor and control the functioning of devices forming part of the transmission system. The protection systems detect, among other things, short-circuits, over-currents and over-voltages in the transmission lines, transformers and other parts of the power transmission system.

Protection equipment is used throughout the electrical power transmission system for providing such protection and control. The protection equipment detects and isolates faults on, for example, transmission and distribution lines by opening circuit breakers, and thereafter restoring power flow after the fault has been eliminated. Alternatively, the protection equipment may be arranged to select an alternative route for the power flow upon detection of a fault.

Current differential protection is a reliable method for detecting faults and thereby protecting the power network. It is based on the idea of comparing currents on both sides of a protected zone, e.g. a transmission line, or a protected unit, e.g. a transformer. Under normal operating conditions, the sum of all currents entering and leaving a protected transmission line is equal to zero.

Uncompensated transmission lines typically range from a few kilometers up to a few hundred kilometers. In order to transmit power along even longer transmission lines, e.g. up to thousands of kilometers, some kind of compensation is needed for compensating for losses and improving the power transfer. Series compensated transmission lines are compensated by means of capacitors, in the following denoted capacitor bank, arranged at a single location along the transmission line.

FIG. 1 illustrates a transmission line system 1 comprising a transmission line 3 between a station A and a station B. The transmission line 3 is series-compensated by means of a capacitor bank 2. Each side of the transmission line is protected by a current differential protective relay, DIFF $REL_A$ and DIFF $REL_B$, respectively, in the following denoted simply differential relay. Each side of the transmission line 3 is typically also protected by additional protection devices, not discussed herein.

A fault may occur anywhere on the transmission line between the station A and the station B. In particular, for a series-compensated transmission line, the fault may occur between the station A and the capacitor bank 2, or between the capacitor bank 2 and the station B. A device for locating faults, denoted fault locator 6 ($FL_A$), is arranged in the differential relay DIFF $REL_A$ for quickly determining the distance to the fault that has occurred. There are different methods for determining the distance to the fault, and International Patent Application WO 2007/079990, assigned to the same applicant as the present application, discloses one such method for the case of uncompensated transmission lines.

However, to locate faults on series-compensated transmission lines offers several challenges. The capacitance added by the capacitor bank changes the appearance of the location of the fault when using methods successfully applied to uncompensated transmission lines. For example, if the apparent impedance is used as a measure of the distance to a fault, the result is misleading due to the fact that the capacitor bank causes a discontinuity in the transmission line impedance. In particular, the capacitor bank creates a non-linear and current dependent circuit appearing between the substation and the fault location.

It is realized that accurate location of faults on series-compensated transmission lines is very important as such lines usually spread over very large distances, and constitute vital links between the energy production and consumption centres. Different fault location algorithms for series compensated lines have been developed so far, applying one-end or two-end measurements.

Two prior art documents addressing the challenges of locating faults on series-compensated transmission lines include M M Saha, J Izykowski, E Rosolowski, B Kasztenny; "A new accurate fault locating algorithm for series compensated lines", IEEE Transactions on Power Delivery, Vol. 14, No. 3, July 1999, pp 789-797; and M M Saha, J Izykowski, E Rosolowski, B Kasztenny; "Location of fault on series-compensated power transmission lines", U.S. Pat. No. 6,529,010, Mar. 4, 2003. However, the methods described in these documents are based on one-end measurements of current and voltages.

SUMMARY OF THE INVENTION

It is an object of the invention to provide an accurate fault location algorithm for series-compensated lines. In particular, it is an object of the invention to provide means for obtaining accurate fault location even in cases wherein only incomplete two-end measurements are available.

This object, among others, is achieved by means of a method, a fault locator device and computer programs as claimed in the appended independent claims.

In accordance with the invention a method is provided for locating a fault in a series-compensated two-terminal power transmission line comprising a compensating bank for providing series-compensation to the transmission line. Different subroutines are utilized for locating faults on line segments from the first terminal to the compensating bank and line segments from the second terminal to the compensating bank. A selection is then made in order to determine a valid result. The subroutines utilize three phase currents synchronized measurements from both line terminals and a three phase voltage measurements from one terminal for determining the respective per unit distance to a fault. By means of the invention, accurate fault location is provided based on two-end current and one-end voltage signals. Using such set of the fault locator input signals is of great practical importance as this corresponds to the use of two-end measurements of currents accomplished by current differential protective relays with additional incorporation of a locally measured three-phase voltage. Further, as the method is not dependent on obtaining voltage measurements from both transmission line ends, an accurate fault location can be provided even if the fault causes data communication between the transmission line ends to be interrupted.

The invention also relates to a transmission line system, a device for fault protection and computer programs, whereby similar advantages are achieved.

Further features of the invention and advantages thereof will become clear by reading the following description.

BRIEF DESCRIPTION OF THE DRAWINGS

FIG. 4a illustrates the principle of equivalenting, FIG. 4b illustrates voltage-current characteristic of MOV, FIG. 4c illustrates equivalent resistance, FIG. 4d illustrates equivalent reactance.

FIG. 6a subroutine SUB_A, FIG. 6b subroutine SUB_B.

DETAILED DESCRIPTION OF EMBODIMENTS OF THE INVENTION

Figure 1:
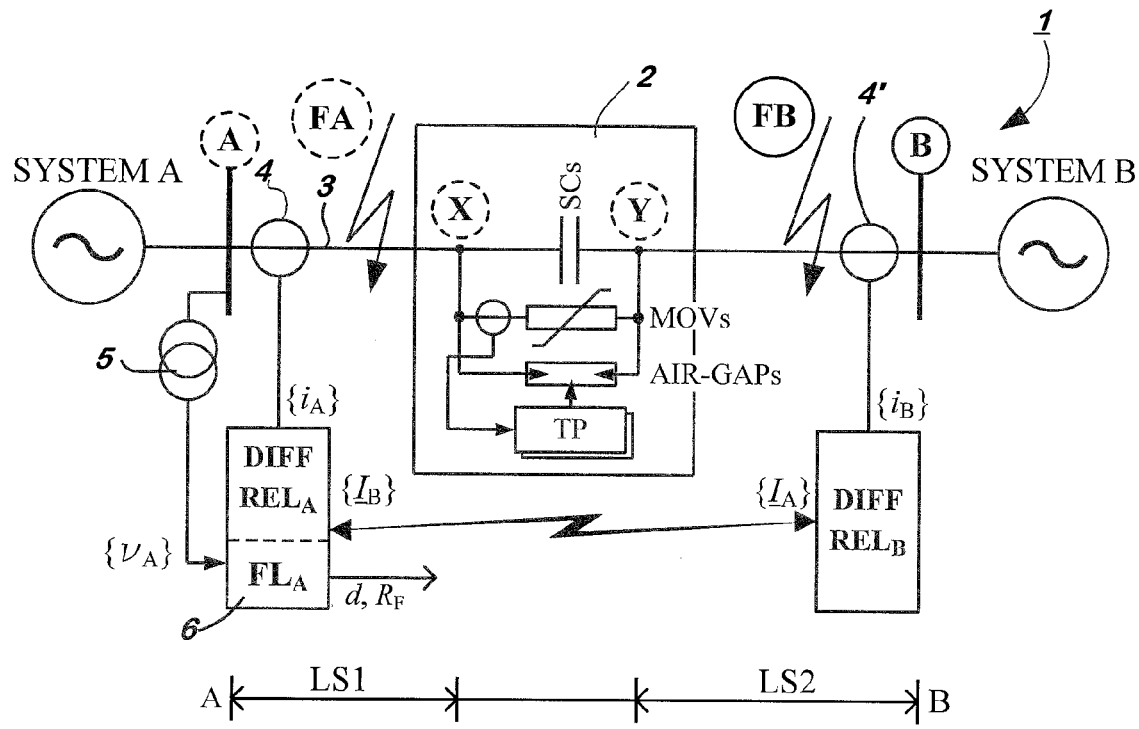
FIG. 1 is a schematic diagram of fault location on a series-compensated line associated with current differential protective relays.

The same reference numerals are used throughout the figures and description for denoting same or corresponding parts.

The developed fault location algorithm in accordance with the present invention is suitable for application to a transmission line, or distribution line, compensated with a capacitor bank, for example a three-phase bank of fixed series capacitors equipped with MOVs (metal oxide varistors), in the following abbreviated SC&MOV, for overvoltage protection.

FIG. 1 illustrates the transmission line system 1 wherein the two-terminal transmission line 3 is series-compensated by means of a compensating bank, in the following denoted capacitor bank 2. A fault locator 6 is installed at the transmission line end A (or terminal A). The fault locator 6 is provided with current and voltage measurement values from the transmission line 3. Current measurements are provided from both line ends A, B and voltage measurements are provided from one end (the local end, i.e. the end wherein the fault locator 6 is arranged). The measurement values may for example be provided from current transformers 4, 4' and a voltage transformer 5, measuring three-phase current and voltage at this end. Although this conventional means for obtaining measurement values are shown in the figures, other means for obtaining such measurement values can be utilized.

In conventional manner, a three-phase current measurement from the other end of the transmission line 3 (as seen from the location of the fault locator 6), end B, is communicated to the fault locator 6 via a suitable communication channel. The fault locator 6 can alternatively be installed at the line end B, or there may be fault locators installed on both transmission line 3 ends A, B.

As the two-end measurements of current are taken from current differential relays, these measurements are considered as having a common time basis, i.e. they are synchronised and there is no need for analytical synchronization of them. However, it is noted that if synchronization should be needed, any known method for obtaining synchronized current measurements may be utilized.

As mentioned earlier, a fault is of a random nature and may appear at any transmission line 3 section, i.e. between the station A and the capacitor bank 2 or between the capacitor bank 2 and the station B. A fault occurring between station A and the capacitor bank 2 is in the present application denoted FA and a fault occurring between the capacitor bank 2 and station B is denoted FB.

In accordance with the invention, two subroutines, SUB_A, SUB_B, are utilised for locating these hypothetical faults FA and FB, respectively. The final result, i.e. the determination of the fault location, will thereafter be selected with the use of a selection procedure.

The capacitor bank 2, preferably the mentioned three-phase SC&MOV bank, divides the transmission line 3 of length l [km] into two line segments having the length: $d_{SC}$ [p.u. (per unit measurement)] and $(1-d_{SC})$ [p.u.], see FIG. 2. The subroutines SUB_A, SUB_B determine the per unit distance to a fault, $d_{FA}$, $d_{FB}$, each related to the length of the particular line segment: $(d_{SC}l)$ or $((1-d_{SC})l)$, where l is the whole transmission line 3 length [km]. Finally, one recalculates these relative distances: $d_{FA}$, $d_{FB}$ into the distances: $d_A$, $d_B$—expressed also in [p.u.], but related to the common base, i.e. to the whole transmission line length l [km]:

$$d_A = d_{FA} \cdot d_{SC} \quad (1)$$

$$d_B = d_{FB} \cdot (1 - d_{SC}) \quad (2)$$

Figure 2:
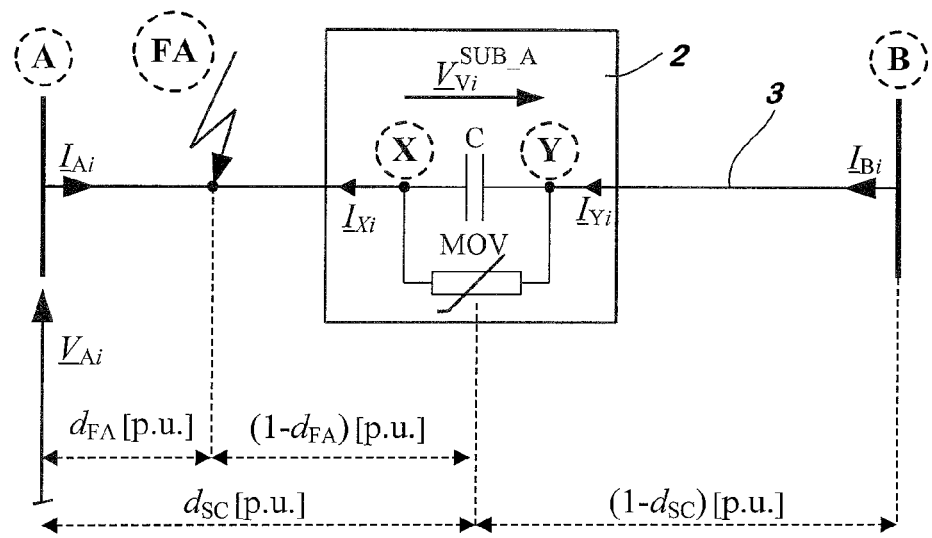
FIGS. 2-3 illustrate circuit diagrams of the faulted series-compensated transmission line.
Figure 3:
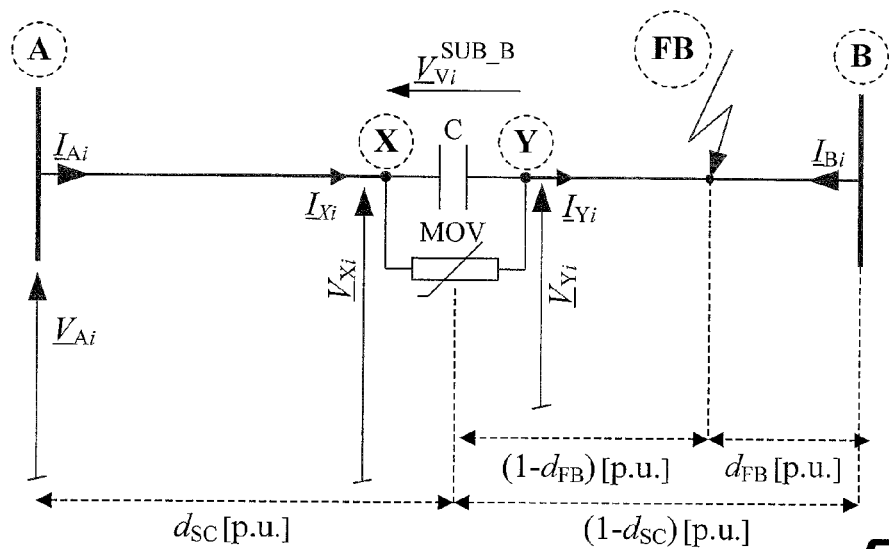

FIG. 2 and FIG. 3 present circuit diagrams of the faulted series-compensated transmission line 3, which are considered for deriving the fault location subroutines SUB_A, SUB_B in accordance with the invention.

In the following description, symmetrical components are mentioned and used, and for the sake of completeness such components are shown below, although reference is made, for example to "Symmetrical Components, Applied to Electric Power Networks", by G O Calabrese and published by The Roland Press Company, New York, 1959 for further details.

Thus, three-phase (a, b, c) quantities to symmetrical components are obtained as:

$$\begin{bmatrix} \underline{V}_{A0} \\ \underline{V}_{A1} \\ \underline{V}_{A2} \end{bmatrix} = \frac{1}{3} \begin{bmatrix} 1 & 1 & 1 \\ 1 & \underline{a} & \underline{a}^2 \\ 1 & \underline{a}^2 & \underline{a} \end{bmatrix} \cdot \begin{bmatrix} \underline{V}_{Aa} \\ \underline{V}_{Ab} \\ \underline{V}_{Ac} \end{bmatrix}$$

wherein $\underline{a} = \exp(j2\pi/3)$

Further, distributed parameter line model is also mentioned, and reference is made, for example to "Power Systems Harmonics, Fundamentals, Analysis and Filter Design" by George J Walkileh, published by Springer, 2001, for details thereof.

In the following, the respective subroutines will first be described separately, thereafter a selection procedure for selecting results from SUB_A or SUB_B for determining the distance to a fault is described, followed by a description of a particular embodiment of the invention comprising fault locators at both transmission lines, and finally a brief summary of the inventive method is described.

1. Fault Location Subroutine SUB_A

Subroutine SUB_A is used for calculating distances to faults FA occurring between transmission line end A and the capacitor bank 2, wherein the fault locator is arranged at transmission line end A.

With reference first to FIG. 2, the subroutine SUB_A, designed for locating faults FA within the line section A-X, is based on the following generalized fault loop model:

$$\underline{V}_{Ap} - d_{FA}\underline{Z}_{1LA}\underline{I}_{Ap} - R_{FA}\underline{I}_{FA} = 0 \quad (3)$$

where:
$d_{FA}$ is the unknown distance to fault [p.u.] occurring on section A-X;
$R_{FA}$ is the unknown fault resistance;
$\underline{V}_{Ap}, \underline{I}_{Ap}$ is the fault loop voltage and current;
$\underline{I}_{FA}$ is the total fault current (fault path current);
$\underline{Z}_{1LA}$ is the positive sequence impedance of the line section A-X (note: $\underline{Z}_{1LA} = d_{SC}\underline{Z}_{1L}$, where: $\underline{Z}_{1L}$ is the positive-sequence impedance of the whole transmission line, and $d_{SC}$ is the relative distance as indicated in FIG. 2).

Fault loop voltage and current are composed according to fault type, as the following weighted sums of the respective symmetrical components of the measured signals:

$$\underline{V}_{Ap} = \underline{a}_1 \underline{V}_{A1} + \underline{a}_2 \underline{V}_{A2} + \underline{a}_0 \underline{V}_{A0} \quad (4)$$

$$\underline{I}_{Ap} = \underline{a}_1 \underline{I}_{A1} + \underline{a}_2 \underline{I}_{A2} + \underline{a}_0 \frac{\underline{Z}_{0LA}}{\underline{Z}_{1LA}} \underline{I}_{A0} \quad (5)$$

where:
$\underline{a}_1, \underline{a}_2, \underline{a}_0$ are weighting coefficients dependent on type of fault (see Table 1 below for different faults);
$\underline{V}_{A1}, \underline{V}_{A2}, \underline{V}_{A0}$ are symmetrical components of side A voltages;
$\underline{I}_{A1}, \underline{I}_{A2}, \underline{I}_{A0}$ are symmetrical components of side A currents;
$\underline{Z}_{0LA}$ are zero sequence impedance of the transmission line section A-X.

Fault loop signals of equations (4) and (5) are expressed in terms of the respective symmetrical components. Use of such notation is convenient for introducing the compensation for line shunt capacitances. Natural sequence of phases: a, b, c was assumed for determining the weighting coefficients (Table 1), as well as in all further calculations of symmetrical components.

TABLE 1

Weighting coefficients for composing fault loop signals eq. (4)-(5).

| FAULT | $a_1$ | $a_2$ | $a_0$ |
|---|---|---|---|
| a-g | 1 | 1 | 1 |
| b-g | $-0.5 - j0.5\sqrt{3}$ | $0.5 + j0.5\sqrt{3}$ | 1 |
| c-g | $0.5 + j0.5\sqrt{3}$ | $-0.5 - j0.5\sqrt{3}$ | 1 |
| a-b, a-b-g, a-b-c, a-b-c-g | $1.5 + j0.5\sqrt{3}$ | $1.5 - j0.5\sqrt{3}$ | 0 |
| b-c, b-c-g | $-j\sqrt{3}$ | $j\sqrt{3}$ | 0 |
| c-a, c-a-g | $-1.5 + j0.5\sqrt{3}$ | $-1.5 - j0.5\sqrt{3}$ | 0 |

In accordance with the invention, the total fault current is calculated from equation (3) preferably using the following generalized fault model:

$$\underline{I}_{FA} = \underline{a}_{F1}\underline{I}_{FA1} + \underline{a}_{F2}\underline{I}_{FA2} + \underline{a}_{F0}\underline{I}_{FA0} \quad (6)$$

where:
$\underline{a}_{F1}, \underline{a}_{F2}, \underline{a}_{F0}$ are share coefficients, which are used for determining the total fault current (see Table 2 below).

The ith sequence component of the total fault current is determined as a sum of the ith sequence components of currents from both ends of the faulted section A-X:

$$\underline{I}_{FAi} = \underline{I}_{Ai} + \underline{I}_{Xi} \quad (7)$$

where:
$\underline{I}_{Ai}$ is the ith sequence component of current measured at the station A;
$\underline{I}_{Xi}$ is the ith sequence component of current flowing from the compensating capacitor bank towards the fault FA;
subscript 'i' denotes the component type: i=1 is the positive sequence, i=2 is the negative sequence, i=0 is the zero sequence.

Neglecting (for the moment) the line shunt capacitances one obtains:

$$\underline{I}_{FAi} = \underline{I}_{Ai} \times \underline{I}_{Bi} \quad (8)$$

From analysis of boundary conditions of faults, it is realized that it is possible to apply different, alternative sets of coefficients, than those that are used in (6). However, in order to assure high accuracy of fault location, use of the particular set of (6) is preferred. The following priority for usage of particular sequence components (the respective coefficient in (6) is not equal to zero) of measured currents is proposed (see Table 2):

for phase-to-ground and phase-to-phase faults: use of negative sequence components;
for phase-to-phase-to-ground faults: use of negative and zero sequence components;
for three phase symmetrical faults: use of superimposed positive sequence components.

TABLE 2

Share coefficients used in fault model (6).

| FAULT | $a_{F1}$ | $a_{F2}$ | $a_{F0}$ |
|---|---|---|---|
| a-g | 0 | 3 | 0 |
| b-g | 0 | $1.5 + j1.5\sqrt{3}$ | 0 |
| c-g | 0 | $-1.5 - j1.5\sqrt{3}$ | 0 |
| a-b | 0 | $1.5 - j0.5\sqrt{3}$ | 0 |
| b-c | 0 | $j\sqrt{3}$ | 0 |
| c-a | 0 | $-1.5 - j0.5\sqrt{3}$ | 0 |
| a-b-g | 0 | $3 - j\sqrt{3}$ | $j\sqrt{3}$ |
| b-c-g | 0 | $j2\sqrt{3}$ | $j\sqrt{3}$ |
| c-a-g | 0 | $-3 - j\sqrt{3}$ | $j\sqrt{3}$ |
| a-b-c | $1.5 + j0.5\sqrt{3}$ | $1.5 - j0.5\sqrt{3}$*) | 0 |
| a-b-c-g | | | |

*) $a_{F2} \neq 0$, however, negative sequence component is not present under three-phase balanced faults Excluding the positive-sequence components ($\underline{a}_{F1} = 0$) from the total fault current (6) for all faults, except three-phase balanced faults, is characteristic for the share coefficients from Table 2. In case of three-phase balanced faults, only positive sequence components are contained in the signals. The positive-sequence of the total fault current can be calculated as the sum of post-fault positive sequence components from all transmission line terminals. However, in a preferred embodiment it is calculated as the following sum of the superimposed (superscript: 'superimp.') positive sequence currents from the transmission line ends A, B, respectively:

$$\underline{I}_{FA} = \underline{I}_{A1}^{sup\ erimp.} + \underline{I}_{B1}^{sup\ erimp.} \quad (9)$$

where the superimposed positive sequence currents at the right-hand side of (9) are calculated by subtracting the pre-fault positive-sequence current (the superscript: 'pre') from the fault positive-sequence current (there is no superscript) as follows:

$$\underline{I}_{A1}^{sup.\,erimp.} = \underline{I}_{A1} - \underline{I}_{A1}^{pre} \quad (9a)$$

$$\underline{I}_{B1}^{sup.\,erimp.} = \underline{I}_{B1} - \underline{I}_{B1}^{pre} \quad (9b)$$

Finally, negative-, zero- and superimposed positive-sequence components of the measured currents are used in calculation of the total fault current (6). This assures accurate calculation of the fault current flowing through the fault path resistance. This is the case, since the positive sequence components, for which the shunt capacitance effect is the most distinct, are excluded. Avoiding use of positive sequence currents ($\underline{a}_{F1}=0$) in calculating the total fault current was proven to be an important approach, as established by the inventor when developing the present invention.

After resolving (3) into the real and imaginary parts, and eliminating the unknown fault resistance $R_{FA}$, the sought fault distance $d_{FA}$ is determined as:

$$d_{FA} = \frac{\text{real}(\underline{V}_{Ap}) \cdot \text{imag}(\underline{I}_{FA}) - \text{imag}(\underline{V}_{Ap}) \cdot \text{real}(\underline{I}_{FA})}{\text{real}(\underline{Z}_{1LA}\underline{I}_{Ap}) \cdot \text{imag}(\underline{I}_{FA}) - \text{imag}(\underline{Z}_{1LA}\underline{I}_{Ap}) \cdot \text{real}(\underline{I}_{FA})} \quad (10)$$

Having calculated the fault distance by use of equation (10), the fault resistance $R_{FA}$ can now also be determined, as for example from the real part of (3) as:

$$R_{FA} = \frac{\text{real}(\underline{V}_{Ap}) - d_{FA}\text{real}(\underline{Z}_{1LA}\underline{I}_{Ap})}{\text{real}(\underline{I}_{FA})} \quad (11)$$

2. Fault Location Subroutine SUB_B

Subroutine SUB_B is used for calculating distances to faults FB occurring between the capacitor bank 2 and the transmission line end B (line end B need not have any fault locator).

With reference now to FIG. 3, transferring of voltage from the station A towards the compensating capacitor bank 2, up to the point X gives:

$$\underline{V}_{X1} = \underline{V}_{A1}\cos h(\underline{\gamma}_1 d_{SC}l) - \underline{Z}_{c1}\underline{I}_{A1}\sin h(\underline{\gamma}_1 d_{SC}l) \quad (12a)$$

$$\underline{V}_{X2} = \underline{V}_{A2}\cos h(\underline{\gamma}_1 d_{SC}l) - \underline{Z}_{c1}\underline{I}_{A2}\sin h(\underline{\gamma}_1 d_{SC}l) \quad (12b)$$

$$\underline{V}_{X0} = \underline{V}_{A0}\cos h(\underline{\gamma}_0 d_{SC}l) - \underline{Z}_{c0}\underline{I}_{A0}\sin h(\underline{\gamma}_0 d_{SC}l) \quad (12c)$$

where:

$\underline{Z}_{c1} = \sqrt{\underline{Z}_{1L}'/\underline{Y}_{1L}'}$ is the surge impedance of the line for the positive- and negative-sequence;

$\underline{\gamma}_1 = \sqrt{\underline{Z}_{1L}'\underline{Y}_{1L}'}$ is the propagation constant of the line for the positive- and negative-sequence;

$\underline{Z}_{c0} = \sqrt{\underline{Z}_{0L}'/\underline{Y}_{0L}'}$ is the surge impedance of the line for the zero-sequence;

$\underline{\gamma}_0 = \sqrt{\underline{Z}_{0L}'\underline{Y}_{0L}'}$ is the propagation constant of the line for the zero-sequence;

$\underline{Z}_{1L}'$ is the impedance of the line for the positive- and negative-sequence ($\Omega$/km);

$\underline{Y}_{1L}'$ is the admittance of the line for the positive- and negative-sequence (S/km);

$\underline{Z}_{0L}'$ is the impedance of the line for the zero-sequence ($\Omega$/km);

$\underline{Y}_{0L}'$ is the admittance of the line for the zero-sequence (S/km).

Transfer of the ith symmetrical sequence current from the beginning of the line section (station A) to the end of the un-faulted section A-X gives:

$$\underline{I}_{X1} = \frac{-\sinh(\underline{\gamma}_1 d_{SC}l) \cdot \underline{V}_{A1}}{\underline{Z}_{c1}} + \cos(\underline{\gamma}_1 d_{SC}l) \cdot \underline{I}_{A1} \quad (13a)$$

$$\underline{I}_{X2} = \frac{-\sinh(\underline{\gamma}_1 d_{SC}l) \cdot \underline{V}_{A2}}{\underline{Z}_{c1}} + \cos(\underline{\gamma}_1 d_{SC}l) \cdot \underline{I}_{A2} \quad (13b)$$

$$\underline{I}_{X0} = \frac{-\sinh(\underline{\gamma}_0 d_{SC}l) \cdot \underline{V}_{A0}}{\underline{Z}_{c0}} + \cos(\underline{\gamma}_0 d_{SC}l) \cdot \underline{I}_{A0} \quad (13c)$$

If there is no internal fault in the compensating capacitor bank, then at both sides of the bank we have identical currents:

$$\underline{I}_{Y1} = \underline{I}_{X1} \quad (14a)$$

$$\underline{I}_{Y2} = \underline{I}_{X2} \quad (14b)$$

$$\underline{I}_{Y0} = \underline{I}_{X0} \quad (14c)$$

Note that in case of voltage, at both sides of the compensating capacitor bank 2 there is a different voltage due to presence of voltage drop across the capacitor bank 2. Having the symmetrical components of current at the compensating capacitor bank 2 (at the point X) one can determine phase currents at this point (in the phases: a, b, c):

$$\underline{I}_{X\_a} = \underline{I}_{X0} + \underline{I}_{X1} + \underline{I}_{X2} \quad (15a)$$

$$\underline{I}_{X\_b} = \underline{I}_{X0} + \underline{a}^2\underline{I}_{X1} + \underline{a}\underline{I}_{X2} \quad (15b)$$

$$\underline{I}_{X\_c} = \underline{I}_{X0} + \underline{a}\underline{I}_{X1} + \underline{a}^2\underline{I}_{X2} \quad (15c)$$

where:

$\underline{a} = \exp(j2\pi/3)$ is a complex operator shifting by the angle: $2\pi/3$.

Figure 4A:
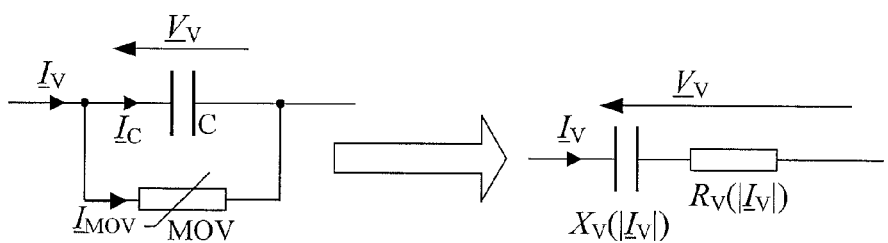
FIGS. 4a-4d illustrate fundamental frequency equivalenting of SC&MOV circuit.
Figure 4B:
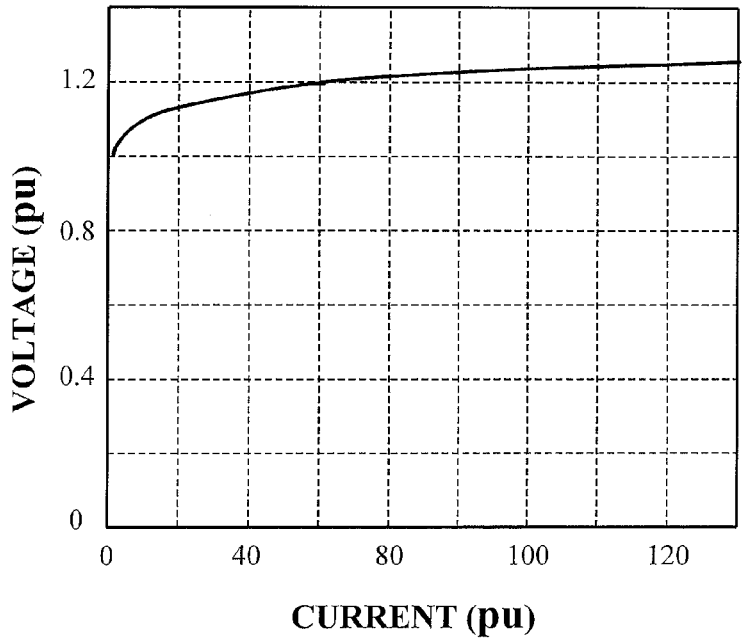
Figure 4C:
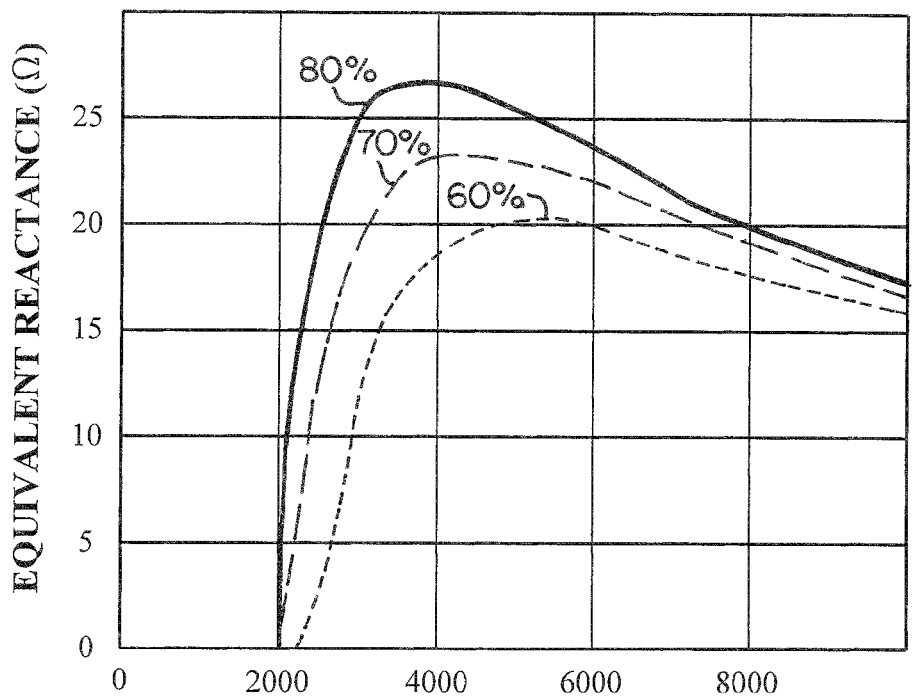
Figure 4D:
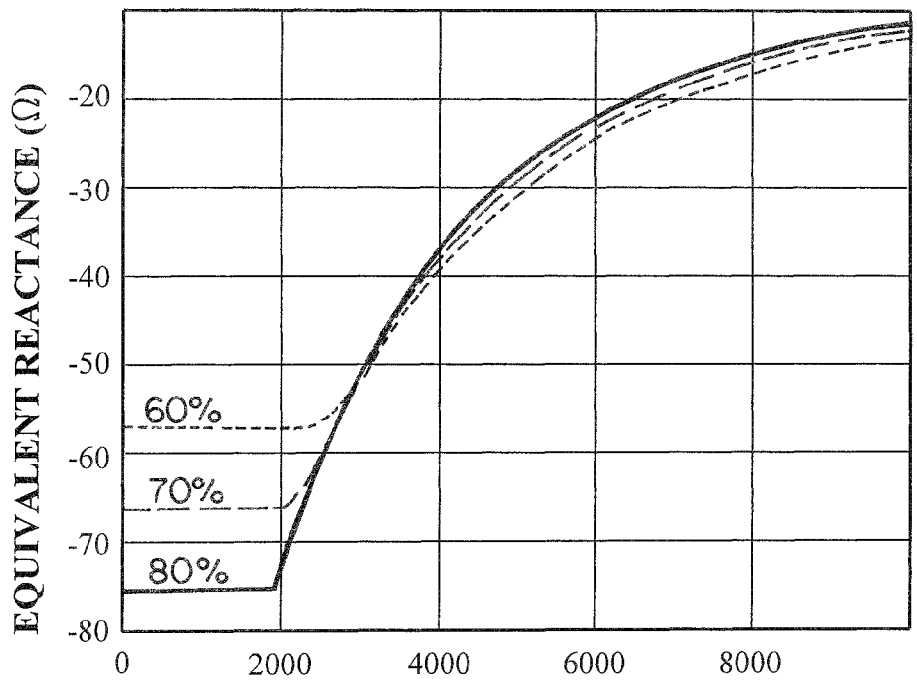

FIG. 4*a* presents the way of the equivalenting of SC&MOV for the fundamental frequency. Typical voltage-current characteristic of an MOV is shown in FIG. 4*b*. A capacitor bank of parallel branches of a SC and its MOV is represented for the fundamental frequency phasors by equivalent resistance $R_V$ and reactance $X_V$, connected in series (FIG. 4*a*). ATP/EMTP (Alternative Transients Program—Electromagnetic Transients Program) is suitable for use here, ATP being the PC version of the Electromagnetic Transients Program, and the EMTP being a simulation program commonly used within the electric power industry. For further details on ATP-EMTP reference is made to, for example, H. Dommel, "Electro-Magnetic Transients Program", BPA, Portland, Oreg., 1986. A software program containing the ELECTRICAL NETWORK and the MODELS units of the ATP-EMTP software package can be applied for determining the equivalents. The equivalent resistance and reactance are obtained as dependent on amplitude of the current entering the original circuit. This has been achieved by scanning over the wide range for amplitude of the fault current entering the SC&MOV. Equivalent resistance and reactance, determined for different compensation rates (60, 70, 80%) of an analysed 400 kV, 300 km transmission network with a single-circuit transmission line are presented in FIG. 4*c* and FIG. 4*d*.

The voltage drops:

$$\underline{V}_{V\_a}^{SUB\_B} = \underline{Z}_{V\_a}(|\underline{I}_{X\_a}|) \cdot \underline{I}_{X\_a} \quad (16a)$$

$$\underline{V}_{V\_b}^{SUB\_B} = \underline{Z}_{V\_b}(|\underline{I}_{X\_b}|) \cdot \underline{I}_{X\_b} \quad (16b)$$

$$\underline{V}_{V\_c}^{SUB\_B} = \underline{Z}_{V\_c}(|\underline{I}_{X\_c}|) \cdot \underline{I}_{X\_c} \quad (16c)$$

where:

$\underline{I}_{X\_a}, \underline{I}_{X\_b}, \underline{I}_{X\_c}$ are phasors of the currents flowing through the capacitor bank of the SC&MOV in particular phases (a, b, c) and the amplitude of the phasor is denoted by "|·|".

Now having the phase voltage drops (16a)-(16c) one determines the sequence components of this voltage drop:

$$\underline{V}_{V1}^{SUB\_B} = \tfrac{1}{3}(\underline{V}_{V\_a}^{SUB\_B} + \underline{a}\underline{V}_{V\_b}^{SUB\_B} + \underline{a}^2 \underline{V}_{V\_c}^{SUB\_B}) \quad (17a)$$

$$\underline{V}_{V2}^{SUB\_B} = \tfrac{1}{3}(\underline{V}_{V\_a}^{SUB\_B} + \underline{a}^2 \underline{V}_{V\_b}^{SUB\_B} + \underline{a}\, \underline{V}_{V\_c}^{SUB\_B}) \quad (17b)$$

$$\underline{V}_{V0}^{SUB\_B} = \tfrac{1}{3}(\underline{V}_{V\_a}^{SUB\_B} + \underline{V}_{V\_b}^{SUB\_B} + \underline{V}_{V\_c}^{SUB\_B}) \quad (17c)$$

Taking (12a)-(12c) and (17a)-(17c) one gets:

$$\underline{V}_{Y1} = \underline{V}_{X1} - \underline{V}_{V1}^{SUB\_B} \quad (18a)$$

$$\underline{V}_{Y2} = \underline{V}_{X2} - \underline{V}_{V2}^{SUB\_B} \quad (18b)$$

$$\underline{V}_{Y0} = \underline{V}_{X0} - \underline{V}_{V0}^{SUB\_B} \quad (18c)$$

In the considered case, the generalised model ( ) describes the fault loop seen from the point Y towards the fault point FB (FIG. 3):

$$\underline{V}_{FBp} - R_{FB}\underline{I}_{FB} = 0 \quad (19)$$

where:

$\underline{V}_{FBp}$ is the fault loop voltage composed accordingly to the fault type, obtained after the analytic transfer from the point Y to the fault point FB, $R_{FB}$ is the unknown fault path resistance, $\underline{I}_{FB}$ is the total fault current (fault path current).

The transfer of the fault loop voltage from the point Y to the fault point FB is equivalent to subtracting the voltage drop across the faulted transmission line section (part of the loop between the point Y and the fault point FB) from the original fault loop voltage at the point Y. The transferred fault loop voltage can be composed as the following weighted sum of the respective symmetrical components:

$$\underline{V}_{FBp} = \underline{a}_1 \underline{V}_{FB1} + \underline{a}_2 \underline{V}_{FB2} + \underline{a}_0 \underline{V}_{FB0} \quad (20)$$

where:

$\underline{a}_1, \underline{a}_2, \underline{a}_0$ are weighting coefficients dependent on fault type, as gathered in Table 1.

Applying the distributed parameter line model, the symmetrical components of voltages from (20) are determined as follows:

$$\underline{V}_{FB1} = \underline{V}_{Y1}\cos h(\underline{\gamma}_1(1-d_{SC})l(1-d_{FB})) - \underline{Z}_{c1}\underline{I}_{Y1}\sin h\,(\underline{\gamma}_1(1-d_{SC})l(1-d_{FB})) \quad (21a)$$

$$\underline{V}_{FB2} = \underline{V}_{Y2}\cos h(\underline{\gamma}_1(1-d_{SC})l(1-d_{FB})) - \underline{Z}_{c1}\underline{I}_{Y2}\sin h\,(\underline{\gamma}_1(1-d_{SC})l(1-d_{FB})) \quad (21b)$$

$$\underline{V}_{FB0} = \underline{V}_{Y0}\cos h(\underline{\gamma}_0(1-d_{SC})l(1-d_{FB})) - \underline{Z}_{c0}\underline{I}_{Y0}\sin h\,(\underline{\gamma}_0(1-d_{SC})l(1-d_{FB})) \quad (21c)$$

where:

$\underline{V}_{Y1}, \underline{V}_{Y2}, \underline{V}_{Y0}$ are symmetrical components of voltage at the point Y, determined in (18a)-(18c);

$\underline{I}_{Y1}, \underline{I}_{Y2}, \underline{I}_{Y0}$ are symmetrical components of current at the point Y, determined in (14a)-(14c);

$d_{FB}$ is the unknown distance from station B to fault FB (p.u.);

l is the length of the transmission line (km), $d_{SC}$ is the relative distance as illustrated in FIG. 2

$\underline{\gamma}_1, \underline{\gamma}_0, \underline{Z}_{c1}, \underline{Z}_{c0}$ as in (12a)-(12c).

Subroutine SUB_B—Total Fault Current $\underline{I}_{FB}$

Again, the total fault current $\underline{I}_{FB}$ is expressed as the following combination of its symmetrical components:

$$\underline{I}_{FB} = \underline{a}_{F1}\underline{I}_{FB1} + \underline{a}_{F2}\underline{I}_{FB2} + \underline{a}_{F0}\underline{I}_{FB0} \quad (22)$$

where:

$\underline{a}_{F1}, \underline{a}_{F2}, \underline{a}_{F0}$ are share coefficients, dependent on fault type and the assumed preference with respect to using particular sequences. The preferred set is provided in Table 3 and differs from the set presented in Table 2 (for the subroutine SUB_A).

TABLE 3

Share coefficients for composing total fault current (22) used in subroutine SUB_B.

| FAULT | $a_{F1}$ | $a_{F2}$ | $a_{F0}$ |
|---|---|---|---|
| a-g | 0 | 3 | 0 |
| b-g | 0 | 3a | 0 |
| c-g | 0 | $3a^2$ | 0 |
| a-b | 0 | 1-a | 0 |
| b-c | 0 | $a-a^2$ | 0 |
| c-a | 0 | $a^2-1$ | 0 |
| a-b-g | $1-a^2$ | 1-a | 0 |
| b-c-g | $a^2-a$ | $a-a^2$ | 0 |
| c-a-g | a-1 | $a^2-1$ | 0 |
| a-b-c, a-b-c-g | $1-a^2$ | $1-a^{2*)}$ | 0 |

*)there is no negative sequence component under these faults and the coefficient can be assumed to be equal to zero It is possible to apply different, but alternative sets of share coefficients, however, the coefficients for which the zero-sequence is eliminated ($\underline{a}_{F0}$=0)—as in Table 3—is a preferred choice for the considered fault location algorithm. In this way, use of the line parameters for the zero-sequence—which are considered as unreliable data—is avoided when determining the total fault current. This is advantageous for assuring the highest possible accuracy of fault location. One can also notice that, when using the share coefficients proposed in Table 3, the preference of using the negative-sequence over the positive-sequence is set for single-phase and phase-to-phase faults.

Figure 5A:
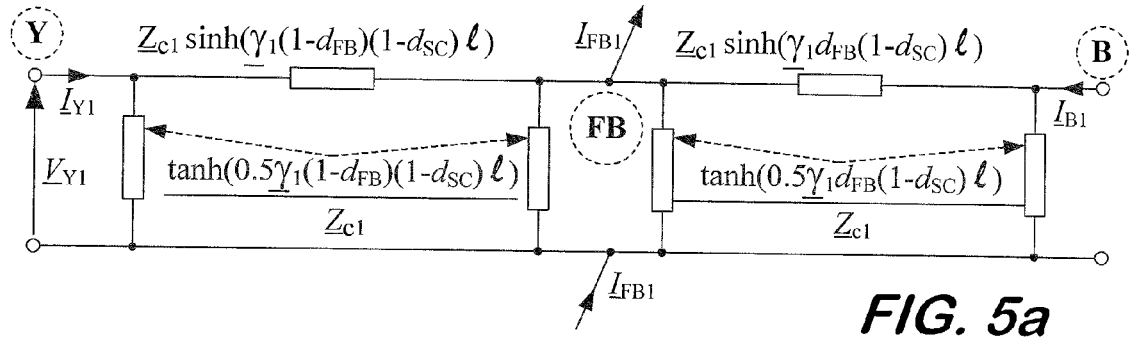
FIG. 5 illustrates equivalent circuit diagram of faulted line section Y-B for: a) positive-sequence, b) negative-sequence.
Figure 5B:
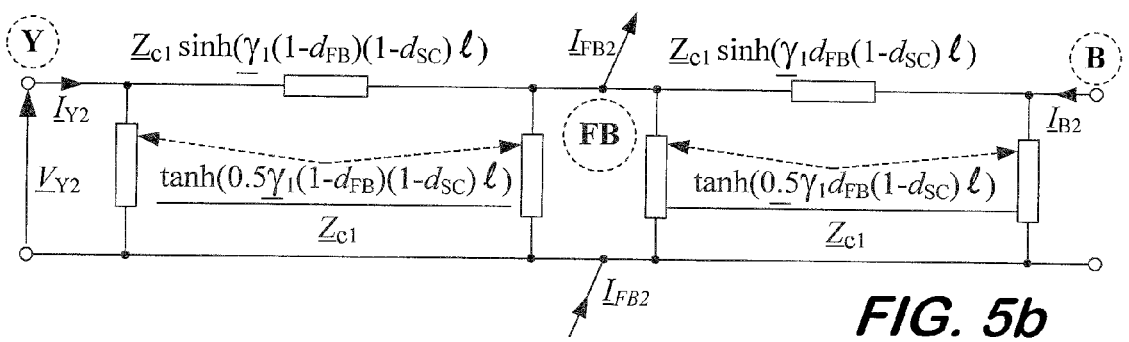

Accurate determination of the symmetrical components of the total fault current can be performed with strict consideration of the distributed parameter model of the faulted transmission line. Such models for the positive-sequence and negative-sequence are presented in FIG. 5. Taking these models into consideration, one can derive the following formula for the i-th symmetrical component of the total fault current:

$$\underline{I}_{FBi} = \frac{\underline{M}_i}{\cosh(\underline{\gamma}_1(1-d_{SC})ld_{FB})} \quad (23)$$

where:

$$\underline{M}_i = \underline{I}_{Bi} + \underline{I}_{Yi}\cosh(\underline{\gamma}_1(1-d_{SC})l) - \frac{\underline{V}_{Yi}}{\underline{Z}_{c1}}\sinh(\underline{\gamma}_1(1-d_{SC})l) \quad (23a)$$

where: i=1: positive-sequence or i=2: negative-sequence.

The obtained formula (23) for the i-th symmetrical component of the total fault current is compact and the unknown distance to fault $d_{FB}$ is involved in the denominator of (23) only, i.e. $d_{FB}$ is not involved in the nominator $\underline{M}_i$.

Substituting the positive- and negative-sequence components of the total fault current into (22), and also taking into account that the zero-sequence is eliminated (Table 3), one obtains the total fault current in the form:

$$I_{FB} = \frac{a_{F1}M_1 + a_{F2}M_2}{\cosh(\underline{\gamma}_1(1-d_{SC})ld_{FB})} \quad (24)$$

where:

$\underline{M}_1$, $\underline{M}_2$ are quantities defined in (23a), $\underline{a}_{F1}$, $\underline{a}_{F2}$ are share coefficients gathered in Table 3.

Subroutine SUB_B: Fault Location Formula

Substitution of the total fault current (24) into the generalised fault loop model (19) gives:

$$\underline{V}_{FBp} - R_{FB} = \frac{a_{F1}M_1 + a_{F2}M_2}{\cosh(\underline{\gamma}_1(1-d_{SC})ld_{FB})} = 0 \quad (25)$$

and finally:

$$\underline{V}_{FBp} \cdot \cos h(\underline{\gamma}_1(1-d_{SC})ld_{FB}) - R_{FB}(\underline{a}_{F1}\underline{M}_1 + \underline{a}_{F2}\underline{M}_2) = 0 \quad (26)$$

where:

$\underline{V}_{FBp}$ is defined in (20) and (21a)-(21c), with use of the weighting coefficients specified for different fault types in Table 1, $\underline{M}_1$, $\underline{M}_2$ are quantities defined in (23a), $\underline{a}_{F1}$, $\underline{a}_{F2}$ are share coefficients dependent on the fault type, as gathered in Table 3.

The derived fault location formula (26) is compact and covers different fault types, that requires setting the appropriate fault type coefficients, as provided in Table 1 and in Table 3.

There are two unknowns in the fault location formula (26): distance to fault $d_{FB}$ and fault resistance $R_{FB}$. After resolving (26) into the real and imaginary parts, one of a number of known numeric procedures for solving nonlinear equations can be applied. The inventor of the present application has found that the Newton-Raphson iterative method is a good choice for that.

Applying the Newton-Raphson method, the start of iterative calculations can be performed with the initial values for the unknowns: $d_{FB}^0$, $R_{FB}^0$, denoted with the superscript 0 (iteration number: 0, as the starting point for the 1st iteration of the calculations). These values can be calculated from the fault location formula (26) adapted to the lumped line model (??) with neglecting shunt capacitances. This can be accomplished by introducing into (26) the substitutions: cos h(x) →1, sin h(x)→x, where x is an argument of the considered hyperbolic trigonometric function. As a result, one obtains the following simplified fault location formula:

$$\underline{V}_{Yp} - (1-d_{FB}^0)(1-d_{SC})\underline{Z}_{1L}\underline{I}_{Yp} - R_{FB}^0\underline{M}_{12}^0 = 0 \quad (27)$$

with the fault loop voltage and current from the point Y, defined for the lumped line model with neglected shunt capacitances:

$$\underline{V}_{Yp} = \underline{a}_1\underline{V}_{Y1} + \underline{a}_2\underline{V}_{Y2} + \underline{a}_0\underline{V}_{Y0} \quad (28)$$

$$I_{Yp} = \underline{a}_1 I_{Y1} + \underline{a}_2 I_{Y2} + \underline{a}_0 \frac{Z_{0L}}{Z_{1L}} I_{Y0} \quad (29)$$

and $$\underline{M}_{12}^0 = \underline{a}_{F1}(\underline{I}_{Y1} + \underline{I}_{B1}) + \underline{a}_{F2}(\underline{I}_{Y2} + \underline{I}_{B2}) \quad (30)$$

Resolving (27) into the real and imaginary parts, the following compact formula for the distance to fault, after eliminating the unknown fault resistance, is obtained:

$$d_{FB}^0 = 1 - \frac{\text{real}(\underline{V}_{Yp}) \cdot \text{imag}(\underline{M}_{12}^0) - \text{imag}(\underline{V}_{Yp}) \cdot \text{real}(\underline{M}_{12}^0)}{\text{real}((1-d_{SC})Z_{1L}I_{Yp}) \cdot \text{imag}(\underline{M}_{12}^0) - \text{imag}((1-d_{SC})Z_{1L}I_{Yp}) \cdot \text{real}(\underline{M}_{12}^0)} \quad (31)$$

Having calculated the distance to the fault (31), one can calculate the other unknown, i.e. the fault resistance. As for example, from the real part of (27) one gets:

$$R_{FB}^0 = \frac{\text{real}(\underline{V}_{Yp}) - (1-d_{FB}^0)\text{real}((1-d_{SC})Z_{1L}I_{Yp})}{\text{real}(\underline{M}_{12}^0)} \quad (32)$$

In practice, for the transmission line section lengths up to 150 km, the simple formulae (31)-(32) can be utilised. However, in order to assure high accuracy of fault location on longer lines, the Newton-Raphson solution of (26), resolved earlier into the real and imaginary parts, has to be applied. The results obtained from (31)-(32) are used for starting these iterative calculations.

3. Selection Procedure

The applied subroutines SUB_A, SUB_B yield the results for 1) a distance to fault and 2) fault resistance: ($d_{FA}$, $R_{FA}$) and ($d_{FB}$, $R_{FB}$), respectively. Only the results from one subroutine are consistent with the actual fault, so the results from the subroutines are analyzed in order to determine which results should be used for locating the fault. The subroutine consistent with the actual fault is denoted a valid subroutine.

First, the subroutine yielding the distance to fault outside the transmission line section range and/or a fault resistance of negative value is rejected. In vast majority of the fault cases this allows to select the valid subroutine.

In case the selection based on the distance to fault and fault resistance appears insufficient, then one has to proceed with further selection. For this purpose, the circuit diagrams of the transmission network for the negative-sequence, relevant for both subroutines (FIG. 6a for SUB_A; and FIG. 6b for SUB_B) have to be considered.

Figure 6A:
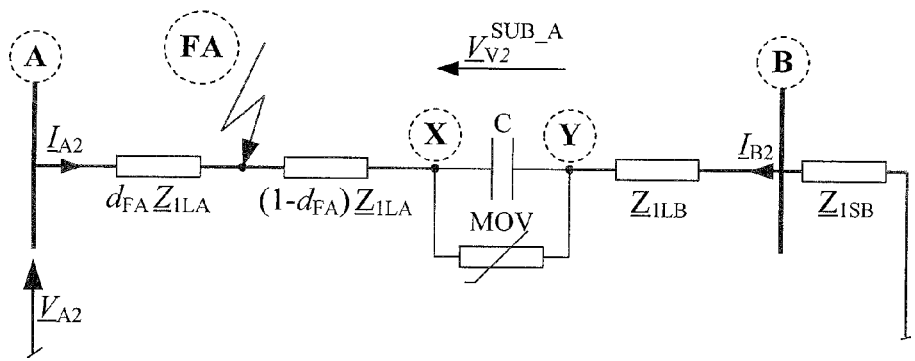
FIGS. 6a and 6b illustrate circuit diagrams of the transmission network for the negative-sequence, considered in the second stage of the selection procedure.
Figure 6B:
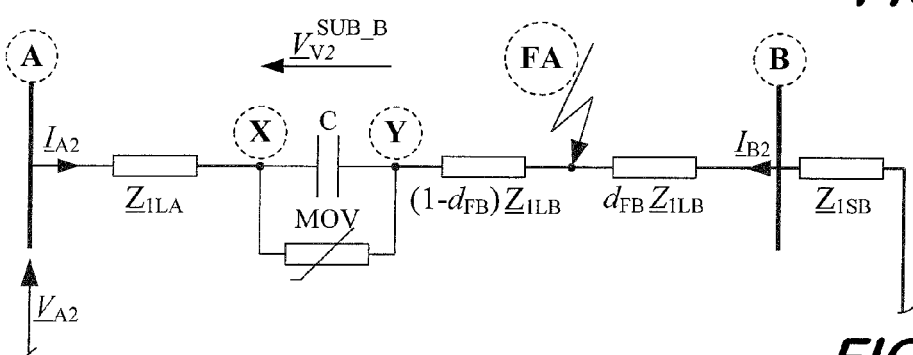

The circuit diagrams of FIGS. 6a and 6b are for the negative-sequence and thus suit different faults with an exception for three-phase balanced faults. In case of three-phase balanced faults there are no negative sequence components and for such faults the superimposed positive-sequence components have to be considered. In both cases:

a) negative-sequence components: for different faults except three-phase balanced faults b) superimposed positive-sequence components: for three-phase balanced faults impedances of the transmission network are identical and are denoted in FIGS. 6a and 6b by using the subscript: 1.

3.1 Subroutine SUB_A:

In relation to FIG. 6a one can derive the negative-sequence voltage at the fault point FA seen from both transmission line sides (superscript A and B, respectively) as:

$$\underline{V}_{FA2}{}^{A}=\underline{V}_{A2}-d_{FA}\underline{Z}_{1LA}\underline{I}_{A2} \qquad (33)$$

$$\underline{V}_{FA2}{}^{B}=-[\underline{Z}_{1LB}+(1-d_{FA})\underline{Z}_{1LA}]\underline{I}_{B2}-\underline{Z}_{1SB}\underline{I}_{B2}-\underline{V}_{V2}{}^{SUB\_A} \qquad (34)$$

where:

$\underline{V}_{V2}{}^{SUB\_A}$ is the negative-sequence of voltage drop across the SCs&MOVs determined from phasors of these voltage drops in particular phases a, b, c: $\underline{V}_{V\_a}{}^{SUB\_A}(|\underline{I}_{B\_a}|)$, $\underline{V}_{V\_b}{}^{SUB\_A}(|\underline{I}_{B\_b}|)$, $\underline{V}_{V\_c}{}^{SUB\_A}(|\underline{I}_{B\_c}|)$ Comparing (33) and (34) one gets the source impedance:

$$\underline{Z}_{1SB}^{SUB\_A} = \frac{-\underline{V}_{V2}^{SUB\_A} - \underline{V}_{A2} + d_{FA}Z_{1LA}\underline{I}_{A2} - [Z_{1LB} + (1-d_{FA})Z_{1LA}]\underline{I}_{B2}}{\underline{I}_{B2}} \qquad (35)$$

3.2 Subroutine SUB_B:

In relation to FIG. 6b one can derive the negative-sequence voltage at the fault point FB seen from both transmission line sides (superscript A and B, respectively) as:

$$\underline{V}_{FB2}{}^{A}=\underline{V}_{A2}-[\underline{Z}_{1LA}+(1-d_{FB})\underline{Z}_{1LB}]\underline{I}_{A2}-\underline{V}_{V2}{}^{SUB\_B} \qquad (36)$$

where:

$V_{V2}{}^{SUB\_B}$ is the negative-sequence of voltage drop across the SCs&MOVs determined from phasors of these voltage drops in particular phases a, b, c: $\underline{V}_{V\_a}{}^{SUB\_B}(|\underline{I}_{A\_a}|)$, $\underline{V}_{V\_b}{}^{SUB\_B}(|\underline{I}_{A\_b}|)$, $\underline{V}_{V\_c}{}^{SUB\_B}(|\underline{I}_{A\_c}|)$ $$\underline{V}_{FB2}{}^{A}=-(d_{FB}\underline{Z}_{1LB}+\underline{Z}_{1SB})\underline{I}_{B2} \qquad (37)$$

Comparing (36) and (37) one gets:

$$\underline{Z}_{1SB}^{SUB\_B} = \frac{-\underline{V}_{V2}^{SUB\_B} - \underline{V}_{A2} - d_{FB}Z_{1LB}\underline{I}_{B2} + [Z_{1LA} + (1-d_{FB})Z_{1LB}]\underline{I}_{A2}}{\underline{I}_{B2}} \qquad (38)$$

3.3 Selection of Valid Subroutine

Subroutine SUB_A is selected as the valid subroutine if the determined source impedance:

$\underline{Z}_{1SB}{}^{SUB\_A}$ (35) has an R-X character and is close to the actual source impedance: $\underline{Z}_{1SB}$.

Subroutine SUB_B is considered as the valid subroutine if the determined source impedance:

$\underline{Z}_{1SB}{}^{SUB\_B}$ (38) has an R-X character and is close to the actual source impedance: $\underline{Z}_{1SB}$.

Figure 7:
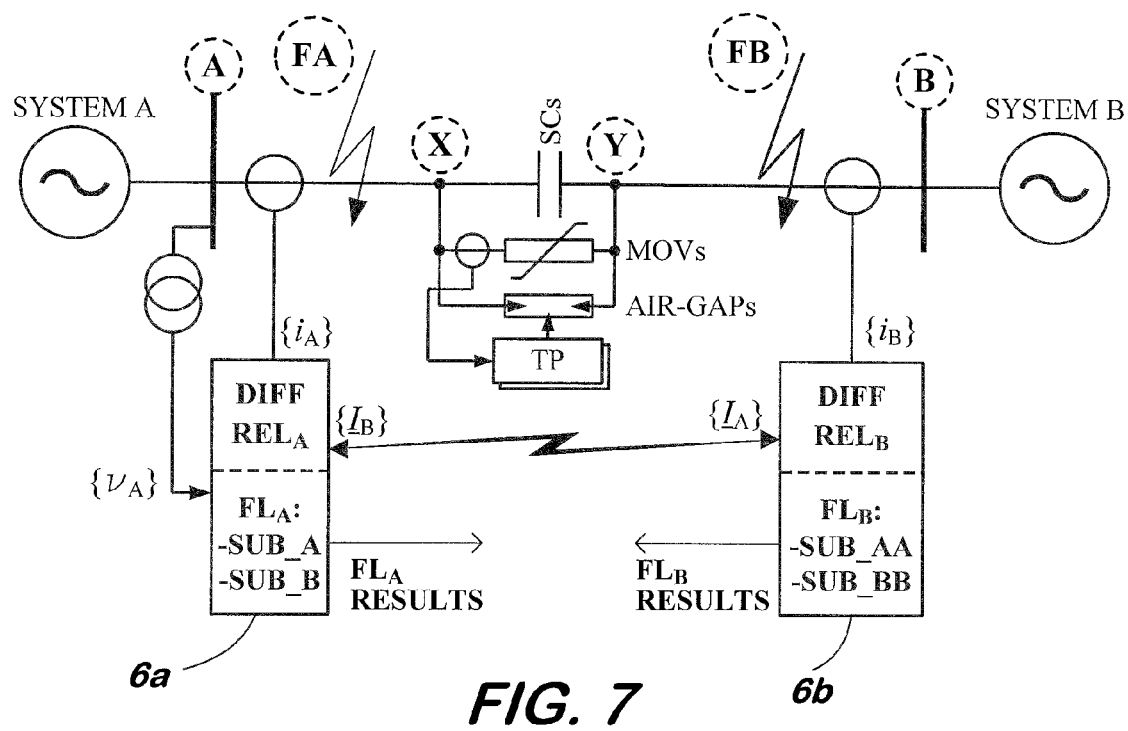
FIG. 7 illustrates an embodiment of the invention, incorporating fault locators at two transmission line ends.

4. Incorporation of Fault Locators into Current Differential Relays at Both Line Ends In the earlier part of this patent application it has been considered that the fault locator is incorporated into the current differential protective relay at one side of the line (for example at the station A—as shown in FIG. 1). However, it is also possible to incorporate the fault locators into the protective relays at both transmission line ends, as is shown in FIG. 7.

In case of using fault locators $6_a$, $6_b$ (see FIG. 7) at both transmission line ends the following subroutines are included in the following fault locators with the respective characteristic of the subroutine in relation to use or avoidance of use of the representation of SCs&MOVs for distance to fault calculation:

location of faults FA on the line section A-X:
 subroutine SUB_A of the fault locator $6_a$ (the representation of SCs&MOVs is not used)
 subroutine SUB_AA of the fault locator $6_b$ (the representation of SCs&MOVs is used)

location of faults FB on the line section B-Y:
 subroutine SUB_B of the fault locator $6_a$ (the representation of SCs&MOVs is used)
 subroutine SUB_BB of the fault locator $6_b$ (the representation of SCs&MOVs is not used).

One gets the fault location results from the fault locators at both transmission line ends and by studying them one is able to identify at which section (the section A-X close to the station A or the section B-Y close to the station B) there is a fault. Having identified the faulted transmission line section (A-X or B-Y) one can take the fault location result from the fault locator for which the faulted transmission line section is closer. Namely, if one identifies a fault on the section A-X then one takes the fault location result from the subroutine SUB_A of the fault locator $6_a$ (the representation of SCs&MOVs is not used). Otherwise if a fault is identified as being on the section B-Y then one takes the fault location result from the subroutine SUB_B of the fault locator $6_b$ (the representation of SCs&MOVs is not used). In this way the representation of SCs&MOVs (based on the fundamental frequency equivalenting) will not influence the fault location results coming from the valid subroutine, i.e. consistent with the actual fault.

5. Summary of Presented Algorithm and Conclusions

Use of two-end current and one-end voltage signals is considered as the input signals for fault location on a series-compensated line has been considered. Such set of the fault locator input signals is of practical importance since this corresponds to use of two-end measurements of currents accomplished by current differential protective relays with additional incorporation of the locally (i.e. at the bus where the fault location function is incorporated into the relay) measured three-phase voltage. In this way the two-end fault location can be accomplished with use of the communication channel of current differential protective relays. Such two-end measurements are considered as synchronised, as is the case for the current differential relays.

The presented fault location algorithm is composed of two location subroutines: SUB_A, SUB_B and the selection procedure which is applied for selecting the valid subroutine, i.e. the subroutine consistent with the actual fault. Both subroutines are formulated for the natural fault loops, composed according to the fault type.

The subroutine SUB_A, which is designated for locating faults on the line section adjacent to the station A where the fault locator is installed, is formulated using the generalised fault loop model. The single first order formula for the distance to fault and fault resistance, in which the complex number coefficients dependent on fault type has been obtained. The lumped line model without accounting for shunt capacitances has been used for formulation of the subroutine. However, further improvement of fault location accuracy can be accomplished by considering the distributed parameter line model, analogously as in typical one-end fault locators for traditional uncompensated lines.

Derivation of the remaining subroutine (SUB_B) starts with analytical transfer of the voltage and current signals from the station A (where the fault locator is installed) towards the compensating capacitor bank. Three-phase signals are decoupled into particular sequence components and the transfer is performed for these quantities with applying the distributed parameter line model. In the next step, the transfer of voltage drop across the compensating bank is done by subtracting the voltage drops across the SCs&MOVs compensating unit, utilising the fundamental frequency equivalenting. After performing the aforementioned two steps, one gets two-end currents and one-end voltage signals as the input signals of the subroutine SUB_B, designated for locating faults within the remote line section, i.e. on the line section beyond the compensating capacitor bank, as seen from the fault locator installation point (station A).

Efficient procedure for selecting the valid subroutine has been developed. This is required since the results from only one subroutine are consistent with the actual fault. First, the subroutine yielding the distance to fault outside the section range and/or the fault resistance of negative value is rejected. In vast majority of the fault cases this allows to select the valid subroutine. Further selection has to be performed only in rare cases for which the selection based on the distance to fault and fault resistance appears insufficient. For this purpose, the circuit diagrams of the transmission network for the negative-sequence (in case of three-phase balanced faults for the superimposed positive sequence), relevant for both subroutines have been considered. The remote source impedance Z1SB is estimated and if this estimated impedance for a particular subroutine has an R-X character and is close to the actual source impedance, then this subroutine is selected as the valid subroutine.

It has been considered that the fault locator function is incorporated into the current differential protective relay at one end of the line (e.g. at the end A). However, it is also possible to incorporate the fault locators into the protective relays at both line sides. Then, one can get the fault location results at both ends and by comparing them one identifies at which section (close to the station A or close to the station B) there is a fault. Having identified the faulted transmission line section one can take the fault location result from the fault locator for which the faulted transmission line section is closer. In this way the representation of SCs&MOVs (based on the fundamental frequency equivalenting) will not influence the fault location results coming from the valid subroutine.

The presented method for fault location on a series-compensated line associated with current differential relays has been tested and evaluated with use of the fault data obtained from an ATP-EMTP simulation of various faults on the transmission line. This has shown validity of the presented method and improved accuracy of fault location, in comparison to the one-end approach as described in the references mentioned in the background section of the present application.

The invented method for locating faults on transmission lines can be incorporated as an added feature of a current differential relay. Current differential relays utilizes phase currents measured synchronously at both line ends for the protection purposes. The signals necessary for the method can thereby be obtained. The method provides an accurate distance to the fault, which can thus rapidly be attended to. A fault locator comprising software, or computer programs, for performing the method can be incorporated into such current differential relay or other fault protection device. In particular, such computer programs are based on the above-described method and thus the above-described equations. The invention thus also provides a device, e.g. a current differential relay, for locating a fault in a series-compensated two-terminal power transmission line, the device comprising a processing unit arranged to carry out the method.

The invention claimed is:
1. A method for locating a fault in a series-compensated two-terminal power transmission line having a length l and comprising a first terminal A and a second terminal B, and further comprising a fault locator and a compensating bank for providing series-compensation to said transmission line, said compensating bank being located at a per unit distance $d_{SC}$ from said terminal A and at a per unit distance $1-d_{SC}$ from said terminal B, wherein $d_{SC}$ and $1-d_{SC}$ are per unit distances of the length l, the method comprising the steps of:

determining, at the fault locator arranged in a differential relay that is incorporated into said transmission line, by means of a first subroutine (SUB_A), a per unit distance $d_{FA}$ to a fault (FA) occurring on a transmission line segment (LS1) between said terminal A and said compensating bank, said line segment (LS1) having said per unit distance $d_{SC}$, wherein said per unit distance $d_{FA}$ is related to $d_{sc}l$, further relating said per unit distance $d_{FA}$ to said transmission line length l by $$d_A = d_{FA} \cdot d_{SC} \quad \text{(eq. 1)},$$

determining, at the fault locator by means of a second subroutine (SUB_B), a per unit distance $d_{FB}$ to a fault (FB) occurring on a transmission line segment (LS2) between said terminal B and said compensating bank, said line segment (LS2) having said per unit distance $1-d_{SC}$, wherein said per unit distance $d_{FB}$ is related to $((1-d_{sc})l)$, further relating said per unit distance $d_{FB}$ to said transmission line length l by $$d_B = d_{FB} \cdot (1-d_{SC}) \quad \text{(eq. 2)},$$

locating said fault by selecting, among the result $d_{FA}$ obtained from said first subroutine (SUB_A) and the result $d_{FB}$ obtained from said second subroutine (SUB_B), the result deemed valid, and calculating said respective per unit distance $d_{FA}$, $d_{FB}$ to a fault (FA, FB), at the fault locator via said first and second subroutines (SUB_A, SUB_B), by utilizing three phase currents synchronized measurements from both terminals (A, B) and a three phase voltage measurements from one terminal (A) received by the fault locator from one or more measurement instruments measuring said transmission line, wherein said first subroutine (SUB_A) performs the steps of:
determining symmetrical current and voltage components $(I_{A1}, I_{A2}, I_{A0}, I_{B1}, I_{B2}, I_{B0}, V_{A1}, V_{A2}, V_{A0},)$ corresponding to said three phase currents synchronized measurements and to said three phase voltage measurements, determining a fault loop voltage ($V_{Ap}$) as seen from terminal A based on said corresponding symmetrical voltage components ($V_{A1}, V_{A2}, V_{A0}$) and based on type of fault, determining a fault loop current ($I_{Ap}$) as seen from terminal A based on said corresponding symmetrical current components ($I_{A1}, I_{A2}, I_{A0}$) and based on type of fault, determining a total fault current ($I_{FA}$) by using a generalized fault model:

$$I_{FA} = a_{F1} I_{FA1} + a_{F2} I_{FA2} + a_{F0} I_{FA0} \quad \text{(eq. 6)},$$

wherein $a_{F1}$, $a_{F2}$, $a_{F0}$ are coefficients related to type of fault and wherein $I_{FAi}$ is determined as a sum of the ith sequence components of currents from both ends (A, X) of said line segment (LS1), neglecting transmission line shunt capacitances, thus obtaining $$I_{Fai} = I_{Ai} + I_{Bi} \quad \text{(eq. 8)}$$

determining said per unit distance $d_{FA}$ based on said fault loop voltage ($V_{Ap}$), on said fault loop current ($I_{Ap}$) and on said total fault current ($I_{FA}$), and wherein said per unit distance $d_{FA}$ is determined by solving $$d_{FA} = \frac{\text{real}(\underline{V}_{Ap}) \cdot \text{imag}(I_{FA}) - \text{imag}(\underline{V}_{Ap}) \cdot \text{real}(I_{FA})}{\text{real}(\underline{Z}_{1LA}\underline{I}_{Ap}) \cdot \text{imag}(I_{FA}) - \text{imag}(\underline{Z}_{1LA}\underline{I}_{Ap}) \cdot \text{real}(I_{FA})}. \quad \text{(eq. 10)}$$

2. The method for locating a fault in a series-compensated two-terminal power transmission line as claimed in claim 1, wherein said first subroutine (SUB_A) further performs the step of determining a fault resistance ($R_{FA}$) occurring on transmission line segment (LS1) between said line end A and said compensating bank and wherein said first subroutine (SUB_A) is based on a generalized fault loop model:

$$V_{Ap} - d_{FA}Z_{1LA}I_{Ap} - R_{FA}I_{FA} = 0 \quad \text{(eq. 3)}$$

where: $V_{Ap}$, $I_{Ap}$ are fault loop voltage and current, respectively; $I_{FA}$ is the total fault current; $Z_{1LA}$ is the positive sequence impedance of the line section A-X, X being a connection point to said compensating bank of said transmission line segment (LS1).

3. The method for locating a fault in a series-compensated two-terminal power transmission line as claimed in claim 1, wherein said first subroutine (SUB_A) further performs the step of determining a fault resistance ($R_{FA}$) occurring on transmission line segment (LS1) between said line end A and said compensating bank, and said second subroutine (SUB_B) further performs the step of determining a fault resistance ($R_{FB}$) occurring on transmission line segment (LS2) between said line end B and said compensating bank, and wherein said step of locating said fault comprises said software selecting results deemed valid by further using said fault resistances ($R_{FA}$, $R_{FB}$).

4. The method for locating a fault in a series-compensated two-terminal power transmission line as claimed in claim 3, wherein said step of said software locating said fault by selecting comprises said software selecting among said distances to fault and said fault resistances ($d_{FA}$, $R_{FA}$; $d_{FB}$, $R_{FB}$) by rejecting distances to fault falling outside the section range and/or by rejecting fault resistances having negative values.

5. The method for locating a fault in a series-compensated two-terminal power transmission line as claimed in claim 3, wherein said step of said software locating said fault by selecting comprises analyzing circuit diagrams of a transmission network, comprising said series-compensated two-terminal power transmission line, for negative-sequence.

6. The method for locating a fault in a series-compensated two-terminal power transmission line as claimed in claim 3, wherein said first subroutine (SUB_A) performs the further step of:

determining said fault resistance ($R_{FA}$) by solving $$R_{FA} = \frac{\text{real}(\underline{V}_{Ap}) - d_{FA}\text{real}(\underline{Z}_{1LA}\underline{I}_{Ap})}{\text{real}(I_{FA})}. \quad \text{(eq. 11)}$$

7. The method for locating a fault in a series-compensated two-terminal power transmission line as claimed in claim 1, wherein said type of fault comprises one of: phase-to-ground fault, phase-to-phase fault, phase-to-phase-to-ground fault, three phase symmetrical faults.

8. The method for locating a fault in a series-compensated two-terminal power transmission line as claimed in claim 1, wherein said second subroutine (SUB_B) performs the steps of:

analytically transferring voltage signals and current signals from said line end A towards said compensating bank, transferring voltage drops across said compensating bank by subtracting voltage drops across said compensating bank utilizing fundamental frequency equivalenting, whereby the above steps provide two-end current signals and one-end voltage signals as input signals to said subroutine (SUB_B).

9. The method for locating a fault in a series-compensated two-terminal power transmission line as claimed in claim 8, wherein said step of transferring voltage signals from said line end A towards said compensating bank, provides:

$$\underline{V}_{X1} = \underline{V}_{A1} \cos h(\underline{\gamma}_1 d_{SC}l) - \underline{Z}_{c1}\underline{I}_{A1} \sin h(\underline{\gamma}_1 d_{SC}l) \quad \text{(eq. 12a)}$$

$$\underline{V}_{X2} = \underline{V}_{A2} \cos h(\underline{\gamma}_1 d_{SC}l) - \underline{Z}_{c1}\underline{I}_{A2} \sin h(\underline{\gamma}_1 d_{SC}l) \quad \text{(eq. 12b)}$$

$$\underline{V}_{X0} = \underline{V}_{A0} \cos h(\underline{\gamma}_0 d_{SC}l) - \underline{Z}_{c0}\underline{I}_{A0} \sin h(\underline{\gamma}_0 d_{SC}l) \quad \text{(eq. 12c)}$$

where:

$\underline{Z}_{c1} = \sqrt{\underline{Z}_{1L}'/\underline{Y}_{1L}'}$ is the surge impedance of the line for the positive- and negative-sequence;

$\underline{\gamma}_1 = \sqrt{\underline{Z}_{1L}'\underline{Y}_{1L}'}$ is the propagation constant of the line for the positive- and negative-sequence;

$Zc0 = \sqrt{\underline{Z}_{0L}'/\underline{Y}_{0L}'}$ is the surge impedance of the line for the zero-sequence;

$\underline{\gamma}_0 = \sqrt{\underline{Z}_{0L}'\underline{Y}_{0L}'}$ is the propagation constant of the line for the zero-sequence;

$\underline{Z}_{1L}'$ is the impedance of the line for the positive- and negative-sequence ($\Omega$/km);

$\underline{Y}_{1L}'$ is the admittance of the line for the positive- and negative-sequence (S/km);

$\underline{Z}_{0L}'$ is the impedance of the line for the zero-sequence ($\Omega$/km);

$\underline{Y}_{0L}'$ is the admittance of the line for the zero-sequence (S/km), and transferring of the ith symmetrical sequence current from said line end A towards said compensating bank give:

$$I_{X1} = \frac{-\sinh(\underline{\gamma}_1 d_{SC}l) \cdot \underline{V}_{A1}}{\underline{Z}_{c1}} + \cos(\underline{\gamma}_1 d_{SC}l) \cdot I_{A1} \quad \text{(eq. 13a)}$$

$$I_{X2} = \frac{-\sinh(\underline{\gamma}_1 d_{SC}l) \cdot \underline{V}_{A2}}{\underline{Z}_{c1}} + \cos(\underline{\gamma}_1 d_{SC}l) \cdot I_{A2} \quad \text{(eq. 13b)}$$

$$I_{X0} = \frac{-\sinh(\underline{\gamma}_0 d_{SC}l) \cdot \underline{V}_{A0}}{\underline{Z}_{c0}} + \cos(\underline{\gamma}_0 d_{SC}l) \cdot I_{A0} \quad \text{(eq. 13c)}$$

assuming no internal faults in said compensating bank, whereby identical currents are obtained:

$$I_{Y1} = I_{X1} \quad \text{(eq. 14a)}$$

$$I_{Y2} = I_{X2} \quad \text{(eq. 14b)}$$

$$I_{Y0} = I_{X0} \quad \text{(eq. 14c)}$$

determining phase currents the phases a, b, c at point X, being the connection point of said line segment (LS1) to said compensating bank, as:

$$I_{X\_a} = I_{X0} + I_{X1} + I_{X2} \quad \text{(eq. 15a)}$$

$$I_{X\_b} = I_{X0} + a^2 I_{X1} + a I_{X2} \quad \text{(eq. 15b)}$$

$$I_{X\_c} = I_{X0} + a I_{X1} + a^2 I_{X2} \quad \text{(eq. 15c)}$$

where: $a = \exp(j2\pi/3)$ is a complex operator shifting by the angle $2\pi/3$.

10. The method for locating a fault in a series-compensated two-terminal power transmission line as claimed in claim 9, wherein said step of transferring voltage drops across said compensating bank comprises:

equivalenting said compensating bank for a fundamental frequency and calculating said voltage drops by:

$$\underline{V}_{V\_a}^{SUB\_B} = \underline{Z}_{V\_a}(|\underline{I}_{X\_a}|) \cdot \underline{I}_{X\_a} \quad \text{(eq. 16a)}$$

$$\underline{V}_{V\_b}^{SUB\_B} = \underline{Z}_{V\_b}(|\underline{I}_{X\_b}|) \cdot \underline{I}_{X\_b} \quad \text{(eq. 16b)}$$

$$\underline{V}_{V\_c}^{SUB\_B} = \underline{Z}_{V\_c}(|\underline{I}_{X\_c}|) \cdot \underline{I}_{X\_c} \quad \text{(eq. 16c)}$$

where: $\underline{I}_{X\_a}, \underline{I}_{X\_b}, \underline{I}_{X\_c}$ are phasors of the currents flowing through said compensating bank, determining sequence components of the above voltage drops:

$$\underline{V}_{V1}^{SUB\_B} = \frac{1}{3}\left(\underline{V}_{V\_a}^{SUB\_B} + \underline{a}\underline{V}_{V\_b}^{SUB\_B} + a^2 \underline{V}_{V\_c}^{SUB\_B}\right) \quad \text{(eq. 17a)}$$

$$\underline{V}_{V2}^{SUB\_B} = \frac{1}{3}\left(\underline{V}_{V\_a}^{SUB\_B} + a^2 \underline{V}_{V\_b}^{SUB\_B} + \underline{a}\underline{V}_{V\_c}^{SUB\_B}\right) \quad \text{(eq. 17b)}$$

$$\underline{V}_{V0}^{SUB\_B} = \frac{1}{3}\left(\underline{V}_{V\_a}^{SUB\_B} + \underline{V}_{V\_b}^{SUB\_B} + \underline{V}_{V\_c}^{SUB\_B}\right) \quad \text{(eq. 17c)}$$

utilizing equations (12a-12c) and (17a-17c) for obtaining $$\underline{V}_{Y1} = \underline{V}_{X1} - \underline{V}_{V1}^{SUB\_B} \quad \text{(eq. 18a)}$$

$$\underline{V}_{Y2} = \underline{V}_{X2} - \underline{V}_{V2}^{SUB\_B} \quad \text{(eq. 18b)}$$

$$\underline{V}_{Y0} = \underline{V}_{X0} - \underline{V}_{V0}^{SUB\_B} \quad \text{(eq. 18c)}$$

utilizing said equivalenting of said compensating bank (2), giving a generalised fault loop model:

$$V_{FBp} - R_{FB} I_{FB} = 0 \quad \text{(eq. 19)}$$

where: $V_{FBp}$ is the fault loop voltage based on fault type, obtained by subtracting said voltage drop across said second line segment (LS2) from a connection point Y, connecting said second line segment (LS2) to said compensating bank, to fault point (FB) of said second line segment (LS2), $R_{FB}$ is the fault path resistance, $I_{FB}$ is the total fault current, expressing said transferred fault loop voltage as:

$$V_{FBp} = a_1 V_{FB1} + a_2 V_{FB2} + a_0 V_{FB0} \quad \text{(eq. 20)}$$

where: $a_1, a_2, a_0$ are weighting coefficients dependent on fault type, applying a distributed parameter line model, for determining the symmetrical components of voltages from (eq. 20):

$$\underline{V}_{FB1} = \underline{V}_{Y1} \cos h(\underline{\gamma}_1(1-d_{SC})l(1-d_{FB})) - \underline{Z}_{c1}\underline{I}_{Y1} \sin h(\underline{\gamma}_1(1-d_{SC})l(1-d_{FB})) \quad \text{(eq. 21a)}$$

$$\underline{V}_{FB2} = \underline{V}_{Y2} \cos h(\underline{\gamma}_1(1-d_{SC})l(1-d_{FB})) - \underline{Z}_{c1}\underline{I}_{Y2} \sin h(\underline{\gamma}_1(1-d_{SC})l(1-d_{FB})) \quad \text{(eq. 21b)}$$

$$\underline{V}_{FB0} = \underline{V}_{Y0} \cos h(\underline{\gamma}_0(1-d_{SC})l(1-d_{FB})) - \underline{Z}_{c0}\underline{I}_{Y0} \sin h(\underline{\gamma}_0(1-d_{SC})l(1-d_{FB})) \quad \text{(eq. 21c)}$$

where: $V_{Y1}, V_{Y2}, V_{Y0}$ are symmetrical components of voltage at said point Y, determined in (eq. 18a)-(eq. 18c); $I_{Y1}, I_{Y2}, I_{Y0}$ are symmetrical components of current at said point Y, determined in (eq. 14a)-(eq. 14c); $d_{FB}$ is the per unit distance from line end B to fault (FB), expressing the total fault current ($I_{FB}$):

$$I_{FB} = a_{F1} I_{FB1} + a_{F2} I_{FB2} + a_{F0} I_{FB0} \quad \text{(eq. 22)}$$

where: $a_{F1}, a_{F2}, a_{F0}$ are share coefficients, dependent on fault type deriving, based on a distributed parameter model of the faulted transmission line, the following formula for the i-th symmetrical component of the total fault current:

$$I_{FBi} = \frac{M_i}{\cosh(\underline{\gamma}_1(1-d_{SC})ld_{FB})} \quad \text{(eq. 23)}$$

where:

$$\underline{M}_i = I_{Bi} + I_{Yi}\cosh(\underline{\gamma}_1(1-d_{SC})l) - \frac{V_{Yi}}{Z_{c1}}\sinh(\underline{\gamma}_1(1-d_{SC})l) \quad \text{(eq. 23a)}$$

where: i=1: positive-sequence or i=2: negative-sequence, obtains the total fault current as:

$$I_{FB} = \frac{a_{F1}M_1 + a_{F2}M_2}{\cosh(\underline{\gamma}_1(1-d_{SC})ld_{FB})} \quad \text{(eq. 24)}$$

where: $M_1, M_2$ are quantities defined in (eq. 23a), substituting the above total fault current into the generalised fault loop model (eq. 19):

$$\underline{V}_{FBp} - R_{FB}\frac{a_{F1}M_1 + a_{F2}M_2}{\cosh(\underline{\gamma}_1(1-d_{SC})ld_{FB})} = 0 \quad \text{(eq. 25)}$$

determining said per unit distance $d_{FB}$ by solving $$\underline{V}_{FBp} \cdot \cos h(\underline{\gamma}_1(1-d_{SC})ld_{FB}) - R_{FB}(\underline{a_{F1}M_1} + \underline{a_{F2}M_2}) = 0 \quad \text{(eq. 26)}.$$

11. The method for locating a fault in a series-compensated two-terminal power transmission line as claimed in claim 10, wherein the equation (eq. 26) is resolved into the real and the imaginary part, and solved by an iterative numerical method, such as Newton-Raphsons method, utilizing the starting points given by:

$$d_{FB}^0 = 1 - \frac{\text{real}(\underline{V}_{Yp}) \cdot \text{imag}(\underline{M}_{12}^0) - \text{imag}(\underline{V}_{Yp}) \cdot \text{real}(\underline{M}_{12}^0)}{\text{real}((1-d_{SC})Z_{1L}\underline{I}_{Yp}) \cdot \text{imag}(\underline{M}_{12}^0) - \text{imag}((1-d_{SC})Z_{1L}\underline{I}_{Yp}) \cdot \text{real}(\underline{M}_{12}^0)} \quad \text{(eq. 31)}$$

and $$R_{FB}^0 = \frac{\text{real}(\underline{V}_{Yp}) - (1-d_{FB}^0)\text{real}((1-d_{SC})Z_{1L}\underline{I}_{Yp})}{\text{real}(\underline{M}_{12}^0)}. \quad \text{(eq. 32)}$$

12. The method for locating a fault in a series-compensated two-terminal power transmission line as claimed in claim 1, wherein said result deemed valid is determined by rejecting results having negative fault resistance value, and/or by rejecting distance to fault values falling outside the respective transmission line section ranges, and/or by determining source impedances ($\underline{Z}_{1SB}^{SUB\_A}, \underline{Z}_{1SB}^{SUB\_B}$) and rejecting results not having R-X character nor being close to actual source impedance ($Z_{1SB}$).

13. The method for locating a fault in a series-compensated two-terminal power transmission line as claimed in claim 12, wherein said source impedance ($\underline{Z}_{1SB}^{SUB\_A}$) is obtained by deriving a negative-sequence voltage at said fault point (FA) as seen from both terminals (A, B) as:

$$\underline{V}_{FA2}{}^A = \underline{V}_{A2} - d_{FA}\underline{Z}_{1LA}\underline{I}_{A2} \qquad \text{(eq. 33)}$$

$$\underline{V}_{FA2}{}^B = -[\underline{Z}_{1LB} + (1-d_{FA})\underline{Z}_{1LA}]\underline{I}_{B2} - \underline{Z}_{1SB}\underline{I}_{B2} - \underline{V}_{V2}{}^{SUB\_A} \qquad \text{(eq. 34)}$$

where: $\underline{V}_{V2}{}^{SUB\_A}$ is the negative-sequence of voltage drop across the compensating bank determined from phasors of these voltage drops in particular phases a, b, c: $\underline{V}_{V\_a}{}^{SUB\_A}(|\underline{I}_{B\_a}|)$, $\underline{V}_{V\_b}{}^{SUB\_A}(|\underline{I}_{B\_b}|)$, $\underline{V}_{V\_c}{}^{SUB\_A}(|\underline{I}_{B\_c}|)$, said source impedance thereafter being obtained by:

$$Z_{1SB}^{SUB\_A} = \frac{-\underline{V}_{V2}^{SUB\_A} - \underline{V}_{A2} + d_{FA}Z_{1LA}I_{A2} -}{I_{B2}} \frac{[Z_{1LB} + (1-d_{FA})Z_{1LA}]I_{B2}}{I_{B2}}. \qquad \text{(eq. 35)}$$

14. The method for locating a fault in a series-compensated two-terminal power transmission line as claimed in claim 12, wherein said source impedance $\underline{Z}_{1SB}{}^{SUB\_B}$ is obtained by deriving a negative-sequence voltage at said fault point (FB) as seen from both terminals (A, B) as:

$$\underline{V}_{FB2}{}^A = \underline{V}_{A2} - [\underline{Z}_{1LA} + (1-d_{FB})\underline{Z}_{1LB}]\underline{I}_{A2} - \underline{V}_{V2}{}^{SUB\_B} \qquad \text{(eq. 36)}$$

where: $V_{V2}{}^{SUB\_B}$ is the negative-sequence of voltage drop across said compensating bank determined from phasors of these voltage drops in particular phases a, b, c: $\underline{V}_{V\_a}{}^{SUB\_B}(|\underline{I}_{A\_a}|)$, $\underline{V}_{V\_b}{}^{SUB\_B}(|\underline{I}_{A\_b}|)$, $\underline{V}_{V\_c}{}^{SUB\_B}(|\underline{I}_{A\_c}|)$ $$\underline{V}_{FB2}{}^A = -(d_{FB}\underline{Z}_{1LB} + \underline{Z}_{1SB})\underline{I}_{B2} \qquad \text{(eq. 37)}$$

said source impedance thereafter being obtained by:

$$Z_{1SB}^{SUB\_B} = \frac{-\underline{V}_{V2}^{SUB\_B} - \underline{V}_{A2} - d_{FB}Z_{1LB}I_{B2} +}{I_{B2}} \frac{[Z_{1LA} + (1-d_{FB})Z_{1LB}]I_{A2}}{I_{B2}}. \qquad \text{(eq. 38)}$$

15. A transmission line system comprising a series-compensated two-terminal power transmission line having a length l and comprising a first terminal A and a second terminal B, and further comprising a compensating bank for providing series-compensation to said transmission line, said compensating bank being located between said terminals (A, B) at a per unit distance $d_{SC}$ from said terminal A and at a per unit distance $1-d_{SC}$ from said terminal B, wherein $d_{SC}$ and $1-d_{SC}$ are per unit distances of the length l, said transmission line being protected at each transmission line terminal (A, B) by a respective fault locator, a first fault locator being arranged at transmission line terminal A, and a second fault locator being arranged at transmission line terminal B, each fault locator comprising means for performing a method of locating a fault in the series-compensated two-terminal power transmission line, the method including the steps of:

determining, by means of a first subroutine (SUB_A), a per unit distance $d_{FA}$ to a fault (FA) occurring on a transmission line segment (LS1) between said terminal A and said compensating bank, said line segment (LS1) having said per unit distance $d_{SC}$, wherein said per unit distance $d_{FA}$ is related to $d_{SC}$l, further relating said per unit distance $d_{FA}$ to said transmission line length l by $$d_A = d_{FA} \cdot d_{SC} \qquad \text{(eq. 1)},$$

determining, by means of a second subroutine (SUB_B), a per unit distance $d_{FB}$ to a fault (FB) occurring on a transmission line segment (LS2) between said terminal B and said compensating bank, said line segment (LS2) having said per unit distance $1-d_{SC}$, wherein said per unit distance $d_{FB}$ is related to $((1-_{SC})l)$, further relating said per unit distance $d_{FB}$ to said transmission line length l by $$d_B = d_{FB} \cdot (1-d_{SC}) \qquad \text{(eq. 2)},$$

locating said fault by selecting, among the result $d_{FA}$ obtained from said first subroutine (SUB_) and the result $d_{FB}$ obtained from said second subroutine (SUB_B), the result deemed valid, and wherein said first and second subroutines (SUB_A, SUB_B) utilize three phase currents synchronized measurements from both terminals (A, B) and a three phase voltage measurements from one terminal (A) for determining said respective per unit distance $d_{FA}$, $d_{FB}$ to a fault (FA, FB), wherein said first subroutine (SUB_A) performs the steps of:

determining symmetrical current and voltage components ($I_{A1}$, $I_{A2}$, $I_{A0}$, $I_{B1}$, $I_{B2}$, $I_{B0}$; $V_{A1}$, $V_{A2}$, $V_{A0}$,) corresponding to said three phase currents synchronized measurements and to said three phase voltage measurements, determining a fault loop voltage ($V_{Ap}$) as seen from terminal A based on said corresponding symmetrical voltage components ($V_{A1}$, $V_{A2}$, $V_{A0}$) and based on type of fault, determining a fault loop current ($I_{Ap}$) as seen from terminal A based on said corresponding symmetrical current components ($I_{A1}$, $I_{A2}$, $I_{A0}$) and based on type of fault, determining a total fault current ($I_{FA}$) by using a generalized fault model:

$$I_{FA} = a_{F1}I_{FA1} + a_{F2}I_{FA2} + a_{F0}I_{FA0} \qquad \text{(eq. 6)}$$

wherein $a_{F1}$, $a_{F2}$, $a_{F0}$ are coefficients related to type of fault and wherein $I_{FAi}$ is determined as a sum of the ith sequence components of currents from both ends (A, X) of said line segment (LS1), neglecting transmission line shunt capacitances, thus obtaining $$I_{Fai} = I_{Ai} + I_{Bi} \qquad \text{(eq. 8)}$$

determining said per unit distance $d_{FA}$ based on said fault loop voltage ($V_{Ap}$), on said fault loop current ($I_{Ap}$) and on said total fault current ($I_{FA}$), wherein said per unit distance $d_{FA}$ is determined by solving $$d_{FA} = \frac{\text{real}(\underline{V}_{AP}) \cdot \text{imag}(\underline{I}_{FA}) - \text{imag}(\underline{V}_{AP}) \cdot \text{real}(\underline{I}_{FA})}{\text{real}(\underline{Z}_{1LA}) \cdot \text{imag}(\underline{I}_{FA}) - \text{imag}(\underline{Z}_{1LA}\underline{I}_{AP}) \cdot \text{real}(\underline{I}_{FA})}, \qquad \text{(eq. 10)}$$

wherein said result deemed valid is determined by rejecting results having negative fault resistance value, and/or by rejecting distance to fault values falling outside the respective transmission line section ranges, and/or by determining source impedances ($\underline{Z}_{1SB}{}^{SUB\_A}$, $\underline{Z}_{1SB}{}^{SUB\_B}$) and rejecting results not having R-X character nor being close to actual source impedance ($Z_{1SB}$), wherein said source impedance $\underline{Z}_{1SB}{}^{SUB\_B}$ is obtained by deriving a negative-sequence voltage at said fault point (FB) as seen from both terminals (A, B) as:

$$\underline{V}_{FB2}{}^A = \underline{V}_{A2} - [\underline{Z}_{1LA} + (1-d_{FB})\underline{Z}_{1LB}]\underline{I}_{A2} - \underline{V}_{V2}{}^{SUB\_B} \qquad \text{(eq. 36)}$$

where: $V_{V2}^{SUB\_B}$ is the negative-sequence of voltage drop across said compensating bank determined from phasors of these voltage drops in particular phases a, b, c: $\underline{V}_{V\_a}^{SUB\_B}$ ($|\underline{I}_{A\_a}|$), $\underline{V}_{V\_b}^{SUB\_B}$ ($|\underline{I}_{A\_b}|$), $\underline{V}_{V\_c}^{SUB\_B}$ ($|\underline{I}_{A\_c}|$)

$$\underline{V}_{FB2}^A = -(d_{FB}\underline{Z}_{1LB} + \underline{Z}_{1SB})\underline{I}_{B2} \tag{eq. 37}$$

said source impedance thereafter being obtained by:

$$\underline{Z}_{1SB}^{SUB\_B} = \frac{\underline{V}_{V2}^{SUB\_B} - \underline{V}_{A2} - d_{FB}\underline{Z}_{1LB}\underline{I}_{B2} + [\underline{Z}_{1LA} + (1 - d_{FB})\underline{Z}_{1LB}]\underline{I}_{A2}}{\underline{I}_{B2}}, \tag{eq. 38}$$

wherein said fault locators are arranged to detect faults in accordance with:

locating faults on the transmission line segment (LS1) between said terminal A and said compensating bank by said first subroutine (SUB_A) of the first fault locator arranged at terminal A, and by a third subroutine (SUB_AA) of the second fault locator arranged at terminal B, said third subroutine (SUB_AA) locating faults in a manner corresponding to said second subroutine (SUB_B), and locating faults on the transmission line segment (LS2) between said terminal B and said compensating bank by said second subroutine (SUB_B) of the second fault locator arranged at terminal B, and by a fourth subroutine (SUB_BB) of the second fault locator arranged at terminal B, said fourth subroutine (SUB_BB) locating faults in a manner corresponding to said first subroutine (SUB_A).

16. The transmission line system as claimed in claim 15, comprising means for identifying on which line segment (LS1, LS2) said fault is located, and wherein distance to fault results from said first subroutine are selected for faults on said first line segment (LS1) and wherein distance to fault results from said fourth subroutine are selected for faults on said second line segment (LS2).

17. A device for locating a fault in a series-compensated two-terminal power transmission line comprising a processing unit, wherein said that processing unit is arranged to carry out the method as claimed in claim 1.

18. The device as claimed in claim 17, wherein said device comprises a current differential relay for protecting said transmission line.

* * * * *